United States Patent
Ma et al.

(10) Patent No.: US 6,773,933 B2
(45) Date of Patent: Aug. 10, 2004

(54) METHOD OF BOOSTING WAFER CLEANING EFFICIENCY AND INCREASING PROCESS YIELD

(75) Inventors: Szu-Tsun Ma, Hsinchu (TW); Kent Kuohua Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 59 days.

(21) Appl. No.: 10/064,369

(22) Filed: Jul. 8, 2002

(65) Prior Publication Data

US 2004/0005780 A1 Jan. 8, 2004

(51) Int. Cl.[7] .................................................. H01L 21/66
(52) U.S. Cl. .................................................. 438/14; 438/690
(58) Field of Search .......................... 438/16, 691, 14

(56) References Cited

U.S. PATENT DOCUMENTS

| | | | |
|---|---|---|---|
| 5,669,979 A | * 9/1997 | Elliott et al. ........................ 134/1 |
| 6,025,206 A | * 2/2000 | Chen et al. ........................ 438/16 |
| 6,635,845 B2 | * 10/2003 | Lee et al. ...................... 219/121.68 |
| 2002/0029956 A1 | * 3/2002 | Allen ........................ 204/157.15 |

* cited by examiner

Primary Examiner—David Nelms
Assistant Examiner—Thao P. Le
(74) Attorney, Agent, or Firm—Jiang Chyun IP Office

(57) ABSTRACT

A method of boosting wafer-cleaning efficiency and increasing process yield. Different types of process particles are deposited on a test wafer. The test wafer is cleaned in a cleaning operation. The test wafer is scanned to determine the types of process particles that are completely removed and the types of process particles that remain over the test wafer. The results of wafer scanning are used to provide an assessment of the efficiency of the cleaning operation. Operation parameters of the cleaning operation are adjusted to maximize the wafer-cleaning efficiency.

20 Claims, 2 Drawing Sheets

METHOD OF BOOSTING WAFER CLEANING EFFICIENCY AND INCREASING PROCESS YIELD

BACKGROUND OF THE INVENTION

1. Field of Invention

The present invention relates to a method of increasing the yield of semiconductor manufacturing. More particularly, the present invention relates to a method of boosting wafer cleaning efficiency and increasing process yield.

2. Description of Related Art

In integrated circuit manufacturing, the most frequently conducted process includes wafer cleaning. Wafer cleaning is an important process that takes up roughly 30% of the time required to build a product. Wafers must be frequently cleaned just to reduce the amount of impurity particles, contaminants and micro dust particles on the surface of a wafer. If these impurities, contaminants and dust particles are allowed to stay on the wafer surface, the semiconductor devices ultimately formed may have a relatively large leakage current and a relatively low breakdown voltage. In some cases, circuit shorting may occur. Consequently, how to boost wafer cleaning efficiency and increase process yield is an important issue in semiconductor production.

In conventional semiconductor manufacturing, a step called particle calibration is often conducted to estimate the efficiency after a wafer cleaning operation. The calibration is conducted using a laser scanner. To perform a calibration, standard polystyrene latex particles fabricated into different dimensions are scanned to obtain a standard curve. Thereafter, the same laser scanner is used to scan the surface of a wafer and find out size of the particles on the wafer by comparing with the standard curve. However, in practice, particles on the wafer have material properties, shape and sizes very different from the polystyrene latex particles. Therefore, the size of the particles estimated by this method is highly inaccurate and judgment of the wafer cleaning process is imprecise.

In addition, particle dimension as well as particle shape may have some significant effect on the device such as the capacity to resist circuit shorting or some other adverse conditions. For example, if the particles produced by a manufacturing step are deposited in the area between two neighboring conductive patterns, the likelihood of having anomalous conduction between the conductive patterns will be increased significantly. Consequently, design rules must be carefully set to minimize the effect of loose particles on device performance.

SUMMARY OF THE INVENTION

Accordingly, one object of the present invention is to provide a method of boosting wafer-cleaning efficiency by providing an accurate assessment of a particular cleaning operation.

A second object of this invention is to provide a method of increasing the process yield of a semiconductor device by simulating the possible size and shape of particles produced in a processing operation so that only processes having no adverse effect on the device are chosen.

To achieve these and other advantages and in accordance with the purpose of the invention, as embodied and broadly described herein, the invention provides a method of boosting wafer-cleaning efficiency. First, different types of process particles are deposited on the surface of a test wafer. Each type of the process particles has a different material property, dimension and/or shape. Furthermore, the location of each type of process particle on the test wafer is positioned according to design. Thereafter, a cleaning operation is conducted to remove particles from the test wafer. The test wafer is scanned by a scanning tool to determine which types of the process particles on the test wafer are completely removed and which types of the process particles are retained. The resulting data, including the shape and dimension of the process particles retained on the test wafer, are registered. Thus, by scanning the test wafer to obtain data, an accurate assessment of the cleaning capacity of a particular cleaning operation is produced. Finally, according to the test data, parameters used in the cleaning operation are modified to improve cleaning efficiency.

This invention also provides a method of improving process yield of a semiconductor device. First, different types of process particles are deposited on a test wafer. Each type of the process particles has a different material property, dimension and/or shape. Furthermore, the location of each type of the process particles on the test wafer is positioned according to design. Thereafter, the process particles on the test wafer are scanned to simulate the type of possible particles generated in an actual processing operation. Using the data obtained through the scanning operation, including the shape and dimension of each type of the process particles, an accurate assessment of the effect of process particles generated in an actual processing operation on the device is produced. If the results indicate that the particles generated in a particular process adversely affect the device, processing parameters may be modified to increase the production yield.

According to the method of boosting wafer-cleaning efficiency, the size of process particles retained after a particular cleaning operation is accurately determined. Since the capacity of a cleaning operation for removing a particular type of the process particles can be gauged with high precision, wafer-cleaning efficiency can be optimized.

According to the method of increasing process yield, a simulation of an actual processing operation is conducted to find all possible process particles that may be generated. Through the result of simulation, possible effects of process particles on the device can be accurately assessed and hence the process yield can be improved.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
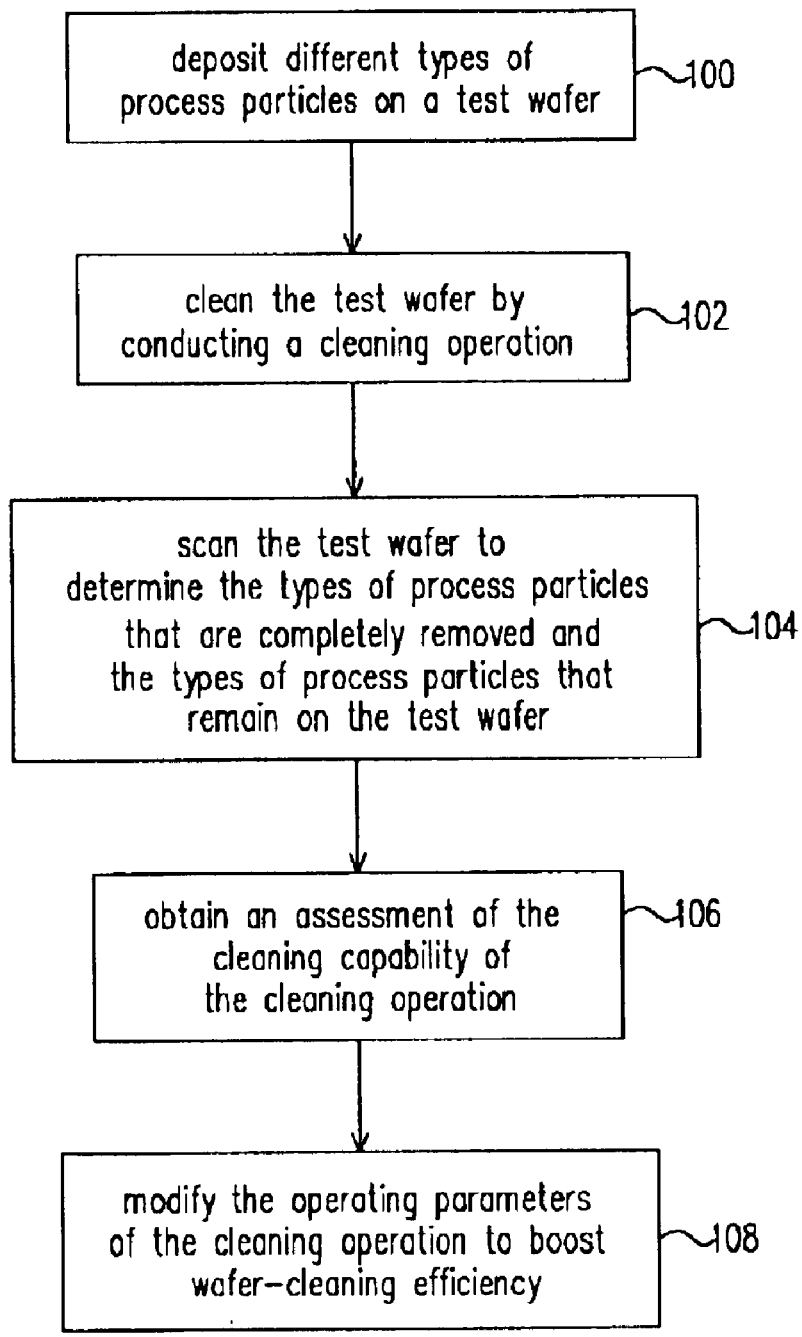
FIG. 1 is a flow chart showing steps carried out to boost wafer-cleaning efficiency according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart showing steps carried out to boost wafer-cleaning efficiency according to a first preferred embodiment of this invention. In step 100, different types of process particles are deposited on a test wafer. The types of process particles encompass all the different types of particles that can be produced in an actual processing operation. Furthermore, the process particles deposited on the test wafer are grouped together according to the type of material, dimension and/or shape.

In this embodiment, process particles deposited on the test wafer include silicon-rich particles, dielectric particles, metallic particles, metallic oxide particles and so on. The silicon-rich particles are, for example, silicon particles or polysilicon particles. The dielectric particles are, for example, silicon nitride ($Si_3N_4$) particles or silicon dioxide ($SiO_2$) particles. The metallic particles are, for example, aluminum (Al) particles, gold (Au) particles, silver (Ag) particles, copper (Cu) particles, nickel (Ni) particles, iron (Fe) particles, titanium (Ti) particles, tantalum (Ta) particles and tungsten (W) particles. The metallic oxide particles are, for example, aluminum oxide ($Al_2O_3$) particles or titanium oxide ($TiO_2$) particles.

In addition, the size of the process particles deposited over the test wafer is, for example, between 0.01 $\mu$m to 1.0 $\mu$m or between 1.0 $\mu$m to 5.0 $\mu$m. When the process particles are deposited onto the test wafer, each type of the process particles is deposited in a designated location.

Thereafter, in step 102, the test wafer is cleaned in a cleaning operation. In step 104, the cleaned test wafer is scanned using a scanning tool to determine which types of the process particles are removed and which types of process particles are retained. The scanning tool can be a laser scanner, for example.

Because the different types of process particles are deposited in a designated location on the test wafer, the types of process particles that are removed or retained can be easily observed. In other words, after the cleaning operation, the types of process particles that are completely removed, the types of process particles that are only partially removed and the capacity of the cleaning process for removing process particles of a particular size are easily found.

Hence, in step 106, information regarding the types of process particles (with a given shape and dimension) that are retained after the cleaning operation is obtained. From such information, effectiveness of a particular cleaning process can be accurately assessed. Finally, in step 108, the set of parameters used for operating the cleaning process may be modified according to the aforementioned testing results.

Figure 2:
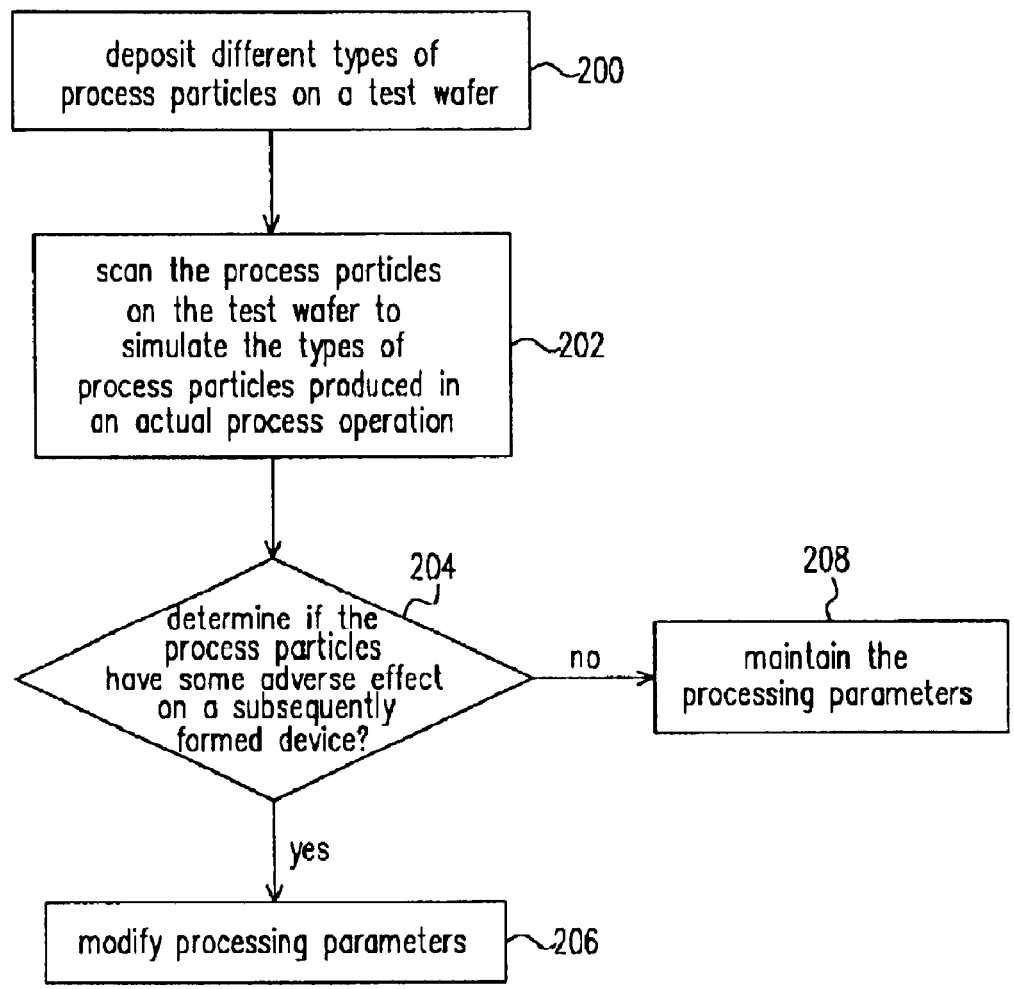
FIG. 2 is a flow chart showing steps carried out to improve process yield according to a second preferred embodiment of this invention.

FIG. 2 is a flow chart showing steps carried out to improve process yield according to a second preferred embodiment of this invention. In step 200, different types of process particles are deposited on a test wafer. The types of process particles encompass all the different types of particles that can be produced in an actual processing operation. Furthermore, the process particles deposited on the test wafer are grouped together according to the type of material, dimension and/or shape.

In this embodiment, process particles deposited on the test wafer include silicon-rich particles, dielectric particles, metallic particles, metallic oxide particles and so on. The silicon-rich particles are, for example, silicon particles or polysilicon particles. The dielectric particles are, for example, silicon nitride ($Si_3N_4$) particles or silicon dioxide ($SiO_2$) particles. The metallic particles are, for example, aluminum (Al) particles, gold (Au) particles, silver (Ag) particles, copper (Cu) particles, nickel (Ni) particles, iron (Fe) particles, titanium (Ti) particles, tantalum (Ta) particles and tungsten (W) particles. The metallic oxide particles are, for example, aluminum oxide ($Al_2O_3$) particles or titanium oxide ($TiO_2$) particles.

In addition, the size of the process particles deposited over the test wafer is, for example, between 0.01 $\mu$m to 1.0 $\mu$m or between 1.0 $\mu$m to 5.0 $\mu$m. When the process particles are deposited onto the test wafer, each type of the process particles is deposited in a designated location.

In step 202, the process particles on the test wafer are scanned to simulate all the possible types of process particles that might be produced in an actual processing operation. Since different types of process particles are deposited over the test wafer at designated locations, the state of each type of the process particles on the test wafer including the type of material, dimension and shape is accurately described.

By scanning the process particles on the test wafer to obtain data such as the shape and dimension of each type of the process particles, the types of process particles (generated during the processing operation) that have some effect on the subsequently formed device may be accurately assessed in step 204. In other words, by finding all possible process particles that might be produced in an actual processing operation, the types of process particles that may lead to device short circuit or some adverse conditions can be easily distinguished.

The results obtained from the aforementioned simulation provide important information to circuit designers for readjusting processing parameters. In other words, if a particular type of process particles is found to have some adverse effect on the device, the processing parameters can be changed in step 206 to increase process yield. On the other hand, if a particular type of the process particles is found to have little effect on the device, the processing parameters may remain as is in step 208. For example, the aforementioned simulation may produce a result that indicates the conductive particles produced in a particular processing operation have a definite size or shape that may lead to an abnormal conductance in a critical film layer. Equipped with such information, a circuit designer might modify the processing parameters to increase the process yield.

In this invention, a simulation of all the possible process particles that might be produced in an actual processing operation is carried out. Thus, a designer may modify processing parameters accordingly to prevent the process particles generated in the actual processing operation from having too much adverse effect on the device. Ultimately, process yield is increased.

In conclusion, major advantages of this invention include:
1. Dimension of process particles remaining after a cleaning operation can be accurately determined. Since particle-removing capacity of a particular cleaning operation can be found with great precision, wafer-cleaning efficiency is greatly improved.
2. A simulation is used to find out all the possible types of process particles produced in an actual processing operation. According to the results of the simulation, the effects process particles produced by a processing operation have on the device can be determined and hence process yield can be improved by modifying the processing parameters.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of increasing wafer-cleaning efficiency, comprising the steps of:

depositing different types of process particles on a test wafer;

conducting a cleaning operation to remove process particles from the test wafer;

scanning the test wafer to determine the type of process particles completely removed from the test wafer and the type of process particles retained on the test wafer;

producing an assessment of the wafer-cleaning operation according to the results obtained by scanning the test wafer for process particles remaining on the test wafer; and adjusting the operating parameters of the cleaning operation to boost wafer-cleaning efficiency.

2. The method of claim 1, wherein each type of the process particles has a different shape, a different dimension and a different material composition.

3. The method of claim 1, wherein the step of depositing process particles onto the test wafer further includes positioning each type of the process particles in a designated location on the test wafer.

4. The method of claim 1, wherein the process particles comprises silicon-rich particles, dielectric particles, metallic particles or metallic oxide particles.

5. The method of claim 4, wherein the silicon-rich particles include silicon particles or polysilicon particles.

6. The method of claim 4, wherein the dielectric particles include silicon dioxide particles or silicon nitride particles.

7. The method of claim 4, wherein the metallic particles include aluminum particles, gold particles, silver particles, copper particles, nickel particles, iron particles, titanium particles, tantalum particles or tungsten particles.

8. The method of claim 4, wherein the metallic oxide particles include aluminum oxide particles or titanium oxide particles.

9. The method of claim 1, wherein average dimension of the process particles is between about 0.01 $\mu$m to 1.0 $\mu$m.

10. The method of claim 1, wherein average dimension of the process particles is between about 1.0 $\mu$m to 5.0 $\mu$m.

11. The method of claim 1, wherein the test wafer is scanned using a laser scanner.

12. A method of increasing process yield, comprising the steps of:

depositing different types of process particles on a test wafer;

scanning the process particles on the test wafer to simulate the types of process particles produced in an actual processing operation;

determining if the process particles have any adverse effect on a subsequently formed device according to the results of the scanning operation; and increasing the process yield of the actual processing operation by modifying the operating parameters of the actual processing operation if the process particles have some adverse effects on the device.

13. The method of claim 12, wherein the each type of the process particles has a different shape, a different dimension and a different material composition.

14. The method of claim 12, wherein the step of depositing process particles onto the test wafer further includes positioning each type of the process particles in a designated location on the test wafer.

15. The method of claim 12, wherein the process particles comprises silicon-rich particles, dielectric particles, metallic particles or metallic oxide particles.

16. The method of claim 15, wherein the silicon-rich particles include silicon particles or polysilicon particles.

17. The method of claim 15, wherein the metallic particles include aluminum particles, gold particles, silver particles, copper particles, nickel particles, iron particles, titanium particles, tantalum particles or tungsten particles.

18. The method of claim 12, wherein average dimension of the process particles is between about 0.01 $\mu$m to 1.0 $\mu$m.

19. The method of claim 12, wherein average dimension of the process particles is between about 1.0 $\mu$m to 5.0 $\mu$m.

20. The method of claim 12, wherein the test wafer is scanned using a laser scanner.

* * * * *